United States Patent
Dobson et al.

[11] Patent Number: 5,567,954
[45] Date of Patent: Oct. 22, 1996

[54] LIGHT EMITTING DEVICE WITH POROUS MATERIAL

[75] Inventors: Peter J. Dobson; Peter A. Leigh, both of Oxford; Richard O. Pearson, London, all of United Kingdom

[73] Assignee: The Secretary of State for Defence in Her Brittanic Majesty's Government of the United Kingdom of Great Britain and Northern Ireland, Farnborough, United Kingdom

[21] Appl. No.: 360,778
[22] PCT Filed: Jun. 22, 1993
[86] PCT No.: PCT/GB93/01316
  § 371 Date: Feb. 28, 1995
  § 102(e) Date: Feb. 28, 1995
[87] PCT Pub. No.: WO94/00885
  PCT Pub. Date: Jan. 6, 1994

[30] Foreign Application Priority Data

Jun. 30, 1992 [GB] United Kingdom ............. 9213824

[51] Int. Cl.⁶ .................................................. H01L 33/00
[52] U.S. Cl. ................... 257/3; 257/95; 257/99; 257/103; 437/228; 437/905; 437/906; 216/51; 216/56; 216/79; 216/108
[58] Field of Search ................................. 257/3, 103, 99, 257/95; 437/905, 906, 904, 228; 216/51, 56, 108, 79

[56] References Cited

U.S. PATENT DOCUMENTS

| | | | |
|---|---|---|---|
| 5,272,355 | 12/1993 | Namavar et al. | 257/3 |
| 5,285,078 | 2/1994 | Mimura et al. | 257/96 X |
| 5,324,965 | 6/1994 | Tompsett et al. | 257/103 |
| 5,331,180 | 7/1994 | Yamada et al. | 257/3 X |
| 5,427,648 | 6/1995 | Pamulapati et al. | 216/99 |

FOREIGN PATENT DOCUMENTS

| | | |
|---|---|---|
| 5327017 | 12/1993 | Japan . |
| 6089891 | 3/1994 | Japan . |
| 6132564 | 5/1994 | Japan ..................................... 257/103 |
| 9219084 | 10/1992 | WIPO . |

OTHER PUBLICATIONS

Bassous et al., "Characterization of Microporous Silicon Fabricated by Immersion Scanning", Mat. Res. Soc. Symp. Proc., vol. 256, 1992, pp. 23–26.

Halimaoui et al., "Electroluminescence in the Visible Range During Anoidc Oxidation of Porous Silicon," Appl. Phys. Lett. 59(3), 15 Jul. 1991, pp. 304–306.

Namavar et al., "Visible Electroluminescence from Porous Silicon NP Heterojunction Diodes," Appl. Phys. Lett, 60(20);18 May 1992, pp. 2514–2516.

Richter et al., "Current-Induced Light Emission From a Porous Silicon Device," IEEE Electron Device Letters, vol. 12, No. 12, Dec. 1991, pp. 691–692.

Koshida et al., "Visible Electroluminescence From Porous Silicon", Appl. Phys. Lett. 60(3), 20 Jan. 1992, pp. 347–349.

Primary Examiner—William Mintel
Attorney, Agent, or Firm—Nixon & Vanderhye P.C.

[57] ABSTRACT

A light emitting device (10) incorporates a layer (12) of porous silicon of low dimensionality surmounted by a discontinuous layer of silver in the form of discrete islands (20). A digitated electrode (13) is connected to the islands (20). The islands (20) have diameters in the range 5 nm to 20 nm and spacings in the range 10 nm to 50 nm, and they form a Schottky diode structure on the silicon (12). Under electrical bias, the diode structure conducts and light is generated. The device (10) is produced by vacuum deposition of silver onto a silicon wafer at a temperature which provides for the silver to separate into individual balls (20). The wafer is then anodized to produce a porous layer incorporating columns of silicon and silicon dioxide surmounted by respective silver islands (20). Each silver island (20) protects the underlying silicon (21) from the anodizing medium, and subsequently provides an electrical contact to the silicon.

39 Claims, 4 Drawing Sheets

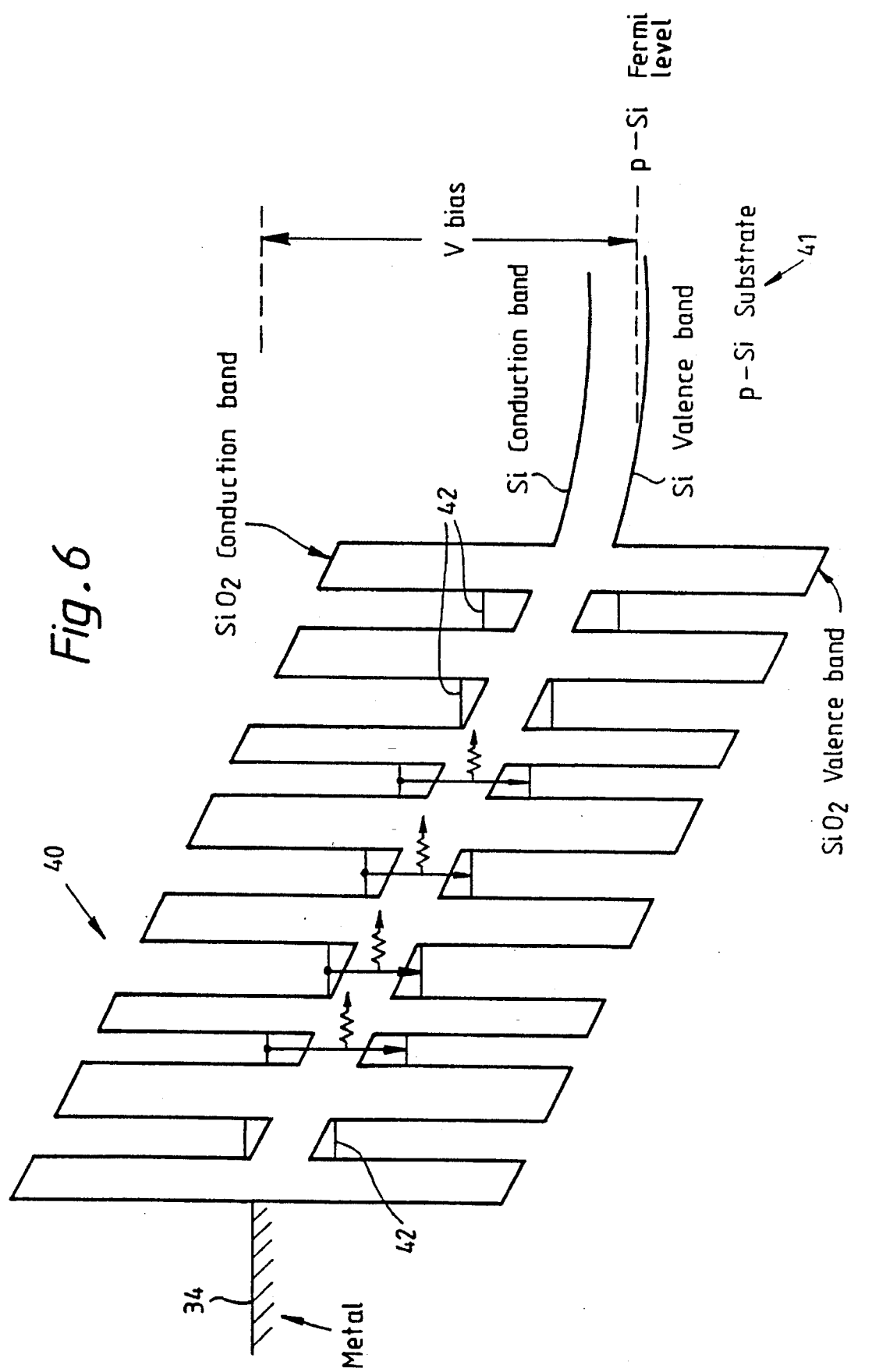

5,567,954

LIGHT EMITTING DEVICE WITH POROUS MATERIAL

BACKGROUND OF THE INVENTION

1. Field of the Invention

This invention relates to a light emitting device and to a method of making such a device. The invention is particularly directed to a device which employs luminescent semiconductor properties.

2. Discussion of Prior Art

There has been much research recently into visible electroluminescence from porous silicon, which is a sponge-like structure made by first anodising and then etching a silicon substrate. Three papers which discuss the present state of the art are as follows: L. T. Canham, "Silicon Quantum wire array fabrication by electrochemical and chemical dissolution of wafers"; Appl. Phys. Lett. 57 (10), 3rd Sep. 1990, page 1046; Nobuyoshi Koshida and Hideki Koyama, "Visible electroluminescence from porous silicon", Appl. Phys. Lett. 60 (3), 20th Jan. 1992, page 347; and Volker Lehman and Ulrich Gösele, "Porous Silicon: Quantum sponge structures grown via a self-adjusting etching process", Adv. Mater. 4 (1992) No. 2, page 114.

The basic prior art light emitting device is disclosed in the aforementioned paper by Koshida and Koyama. It consists of a diode structure made from a substrate of p-type silicon, on top of which is formed a porous layer, typically 0.2 μm to 1.0 μm thick. Electrodes are placed both on the porous layer and on the underside of the substrate so that an electrical bias potential can be applied to the diode. One of the electrodes, that on the porous layer, is made of semitransparent material so that light generated within the diode structure may be emitted.

The porous layer is formed by subjecting the top surface of the substrate to anodisation. This is believed to produce a porous layer comprising an array of columns or wires of low dimensionality, vertical to the surface, and separated by holes or spaces and wherein each column comprises silicon embedded in silicon oxide. Generally the porosity of the layer is increased by subsequent etching. An etchant is used which thins the columns by chemical dissolution, with a resultant increase in the size of the spaces between the columns. Light is generated within the diode structure in response to electrical bias. There is currently some uncertainty in the scientific world as to how the structure emits light.

SUMMARY OF THE INVENTION

The present invention provides a light emitting device incorporating porous material of low dimensionality consisting at least partly of semiconductor material and produced by an etching process, upon the porous material a discontinuous layer comprising islands of electrically conducting and etch resistant material, together with contacting means for making electrical contact to the porous material and the discontinuous layer.

The expression "low dimensionality" in relation to a material means that the material has, in at least one direction, dimensions of the order of or less than the exciton diameter or the De Broglie wavelength of electrons or holes in the material. This leads to quantum confinement in the relevant direction. Quantum wells, quantum wires and quantum dots are known in the prior art and correspond to one, two and three dimensional confinement respectively. In practice, this corresponds to material feature dimensions less than 50 nm in extent, and preferably less than 25 nm.

The invention provides the advantage that it is a light emitting semiconductor device which is activated by electrical bias applied to the contacting means.

The invention also provides the advantage that the residual semiconductor material remaining in the porous layer is that located under the islands of electrically conducting and etch resistant material, which provided protection thereof during the etching process. The islands therefore define the locations of residual semiconductor material, and provide electrical contact to resulting low dimensional semiconductor material. The islands may have diameters of 5 nm to 100 nm, preferably 5 nm to 20 nm or 10 nm to 20 nm, and inter-island spacings may be in the range 10 nm to 500 nm, preferably 10 nm to 50 nm.

The semiconductor material is preferably silicon, and the electrically conducting and etch resistant material is preferably silver forming a Schottky diode structure with the silicon. An embodiment of the invention in which the semiconductor material is silicon and the etch resistant material is silver has produced orange electroluminescence emission in response to electrical bias in the range 7 to 9 volts applied to the contacting means. This range of bias produced current densities in the range 100 to 200 mAcm$^{-2}$.

The contacting means may include a digitated electrode connected to islands of electrically conducting and etch resistant material.

In an alternative aspect, the invention provides a light emitting device incorporating porous material of low dimensionality comprising columns consisting at least partly of semiconductor material tipped with electrically conducting material, and contacting means for making electrical contact to the porous material and to the electrically conducting material.

In a further aspect, the invention provides a method of making a light emitting device including the steps of:

(a) forming a discontinuous layer of islands of electrically conducting and etch resistant material upon semiconductor material, (b) anodising the semiconductor material to produce a porous region consisting at least partly of semiconductor material of low dimensionality and protected from anodisation by the electrically conducting and etch resistant material, and (c) providing electrical connections to the semiconductor material and to the electrically conducting and etch resistant material respectively.

The islands may be 5 nm to 100 nm (preferably 5 nm to 20 nm or 10 nm to 20 nm) in diameter and may have spacings in the range 10 nm, to 100 nm, (preferably 10 nm to 50 nm); they may be distributed in either a random manner or a regular manner on the semiconductor material. Preferably the islands are of metallic material such as silver.

The islands define those regions of the silicon surface which are protected from being anodically attacked, and thus they define the structure of the porous silicon layer in addition to providing electrical contact thereto. Silver is the preferred island material, since it forms a good Schottky barrier to silicon semiconductor material, thus providing a diode structure.

The porous layer may be etched after anodisation.

Electrical connections may be made to islands to form one electrical bias terminal of the device. A second bias terminal may be provided by making an ohmic contact to a side of the semiconductor material remote from the porous layer. The electrical connection to the islands may be formed by depositing a second layer of electrically conducting material such as silver to connect islands together to form an electrically continuous layer. Preferably this second layer is of digitated form, having fingers connecting the islands, and exposing areas of the porous layer between the fingers.

BRIEF DESCRIPTION OF THE DRAWINGS

In order that the invention might be more fully understood, an embodiment thereof will now be described, by way of example only and with reference to the accompanying drawings, in which:

FIG. 6 shows the electronic band structure of the device partly shown in FIG. 5.

DETAILED DISCUSSION OF PREFERRED EMBODIMENTS

Figure 1:
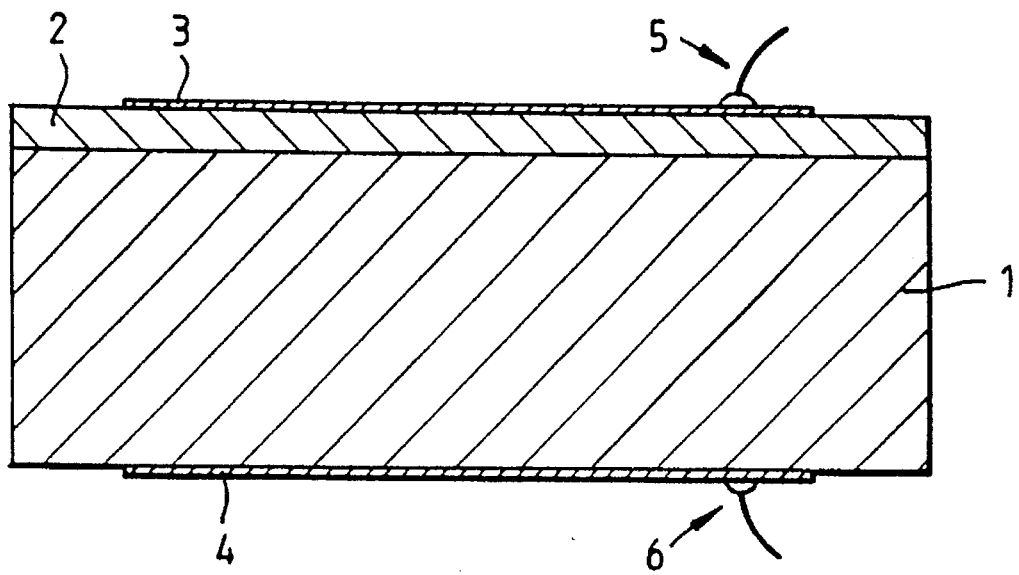
FIG. 1 is a diagrammatic side view of a prior art light emitting device.

Referring to FIG. 1, this illustrates a prior art diode structure as described by Koshida et al previously referred to. It has a substrate 1 of p-type silicon, on top of which is formed a porous layer 2, typically 0.2–1.0 µm thick. Electrodes 3 and 4 are placed on the porous layer 2, and on the underside of the substrate 1 so that suitable potentials can be applied via respective terminals 5,6. Electrode 3, on the porous layer, is made of semi-transparent material so that light generated within the structure may be emitted.

The porous layer 2 is formed by subjecting the top surface of the substrate 1 to anodisation, typically in hydrofluoric acid (HF) and ethanol, and at low moderate current densities, typically 10 mA/cm$^2$, for 5 to 10 minutes. The anodisation is believed to produce a porous layer 2 which is a low dimensional structure having quantum confinement properties as discussed in the prior art. It comprises an array of columns or wires, vertical to the surface, and separated by holes or spaces and wherein each column comprises silicon embedded in silicon oxide. Generally, the porosity of layer 2 is increased by subsequent etching, using an etchant which thins the columns by chemical dissolution, typically to sizes less than 10 nm wide, with a resultant increase in the size of the spaces between the columns.

It is found that, under the correct circumstances, application of a d.c. source to the structure shown in FIG. 1, and with a negative potential on the electrode 3 and a positive potential on the electrode 4, can result in light being generated within the structure. There is currently some uncertainty in the scientific world as to how the silicon emits light, but the exact mechanism is not of relevance as far as concerns the present invention. However, as will be described later in more detail in relation to the invention, it is believed that luminescence emission arises from recombination of quantum confined charge carriers.

Although references are made herein solely to silicon, there is evidence that other semiconductor materials, such as germanium, gallium arsenide and other compound semiconductors also exhibit quantum confinement effects. The specification should be construed accordingly.

Figure 2:
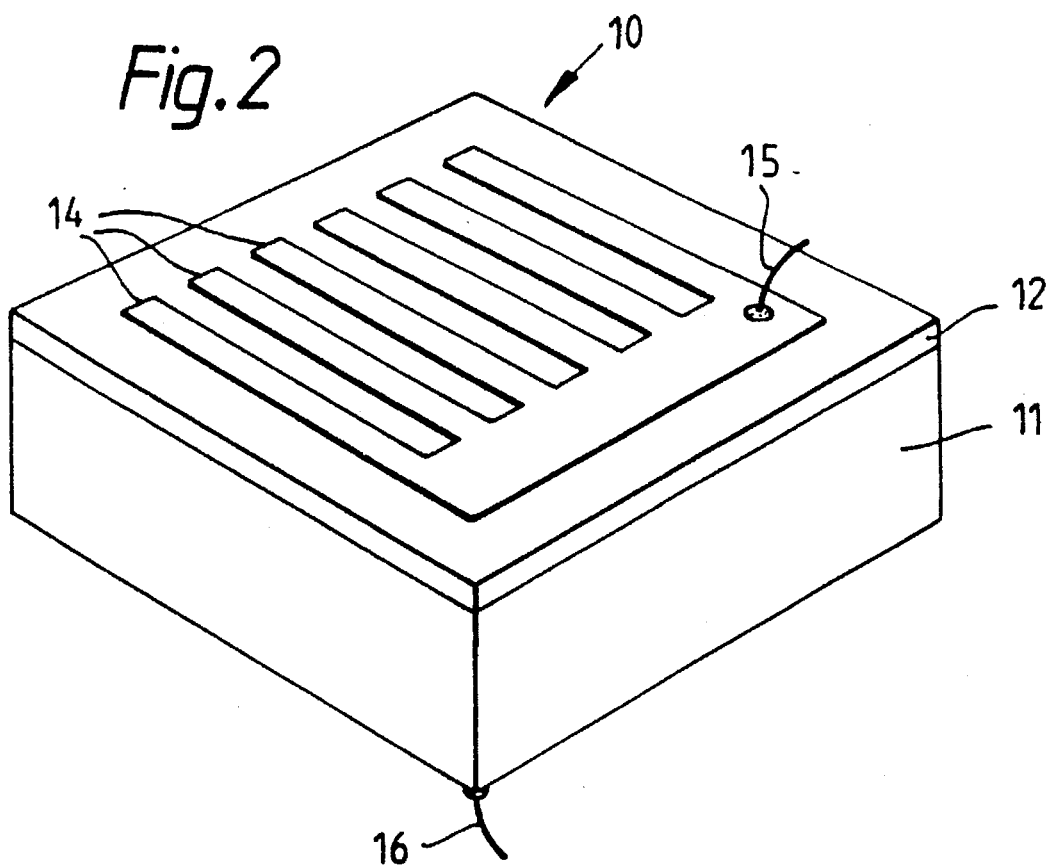
FIG. 2 is a schematic perspective view of a light emitting device of the invention.

Referring to FIG. 2, there is shown a light emitting device of the invention indicated generally by 10. It comprises a substrate 11 of p-type silicon on top of which, by a method to be described, is formed a layer 12 of porous silicon. Formed on the porous silicon layer 12 is a digitated electrode 13 having fingers, such as 14, of silver. In one manifestation the grating pitch of the electrode fingers, 14 is chosen to select and/or enhance the emitted light, and is in the range 0.5 µm to 1 µm. In other manifestations, the fingers 14 would have a width in the range 2 µm to 10 µm and a centre to centre pitch of 4 µm to 10 µm. A typical overall size of electrode 13 would be in the range of 0.1 mm to 1 mm square, and the mean thickness of the electrode silver would be in the range 10 nm to 20 nm.

A plain ohmic contact electrode (not visible) is formed on the undersurface of the substrate 11. Terminals 15 and 16 enable electrical connections to be made to the electrode 13 and ohmic contact respectively.

Figure 3:
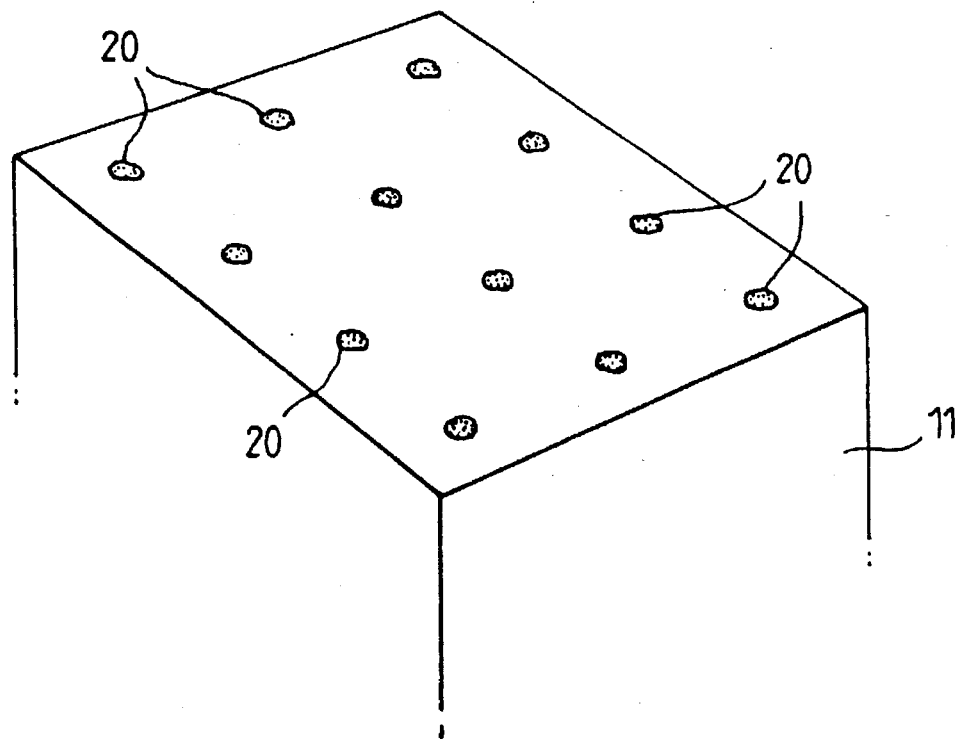
FIGS. 3 and 4 schematically illustrate two successive steps in manufacture of the device of FIG. 2.
Figure 4:
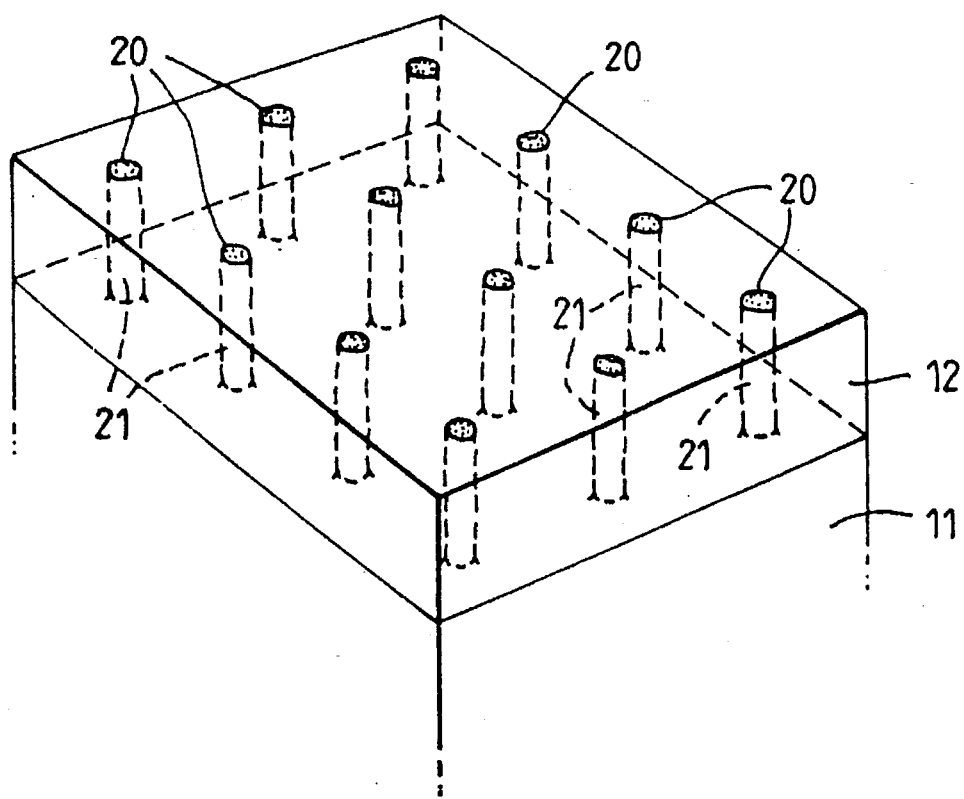

Referring now to FIGS. 3 and 4, in which parts previously described are like-referenced, there are illustrated steps in the method of making the device 10. It is to be emphasised that both FIGS. 3 and 4 are highly schematic and are not to scale.

The process commences by forming on one of the surfaces of the silicon substrate 11 the layer 12 of porous silicon. This is achieved by anodisation of the surface in any known manner, for example as in the prior art, and optionally by subsequent etching of the surface using a suitable chemical etchant. Prior to anodisation, however, the surface is formed with an array of spots or islands 20 of conductive material, preferably silver. The islands may be of irregular shape, but are preferably generally circular. Typical island sizes range from 5 nm or 10 nm to 20 nm diameter and typical spacing between islands is in the range 10 nm to 50 nm. The islands may be irregularly positioned, but preferably they are formed in an ordered array.

The islands 20 are formed by vacuum depositing silver onto the surface of a clean silicon wafer held, typically, at between 300° and 400° K. in such a manner that it forms a discontinuous island film. It is known that thin film deposition of low melting point metals such as silver onto dielectrics such as Si/SiO$_2$ results in an island deposit. This is because of the tendency of a system to minimise its free energy; i.e. because the silver/silica bond is not strong, the silver does not wet the silica, and it tends to ball up and form discrete hemispherical islands. If silver deposition is terminated at around 1 nm to 5 nm average thickness at 300° K., silver islands in the range 5 nm to 20 nm in diameter would be expected, but with a wide variety of separations. Island diameters in the range 10–100 nm could be employed, with inter-island separations in the range 10–500 nm.

Islands 20 define regions of the silicon wafer 11 where anodisation does not occur by protecting the regions underlying the islands from attack. The result is that the anodised layer takes up a structure somewhat similar to that illustrated in FIG. 4 in which isolated columns 21 of silicon underlie the islands and are upstanding from the substrate 11.

Subsequent etching, if required, using a chemical etchant will further define the device structure, and increase the pore size of the porous silicon layer 12 to the desired extent. The islands 20 maintain their protection of the underlying silicon during etching.

Electron microscopy of porous silicon produced as described above has shown small crystallites of silicon and large platelets of an unidentified single crystal phase.

The next stage is to link the islands 20 electrically to form an electrical connection. This is achieved in the described embodiment by forming on the top surface of the structure illustrated in FIG. 4 the digitated electrode structure 13 shown in FIG. 2. This may be achieved by a second silver deposition.

Finally a first ohmic connection 16 is made to the underside of the silicon substrate 11 and a second connection 15 to the electrode 13, so that an appropriate source (not shown) of electrical bias potential may be applied between the connections 15 and 16.

The device 10 shown in FIG. 2 forms a Schottky diode; upon application of a negative pole of an electrical potential source to the terminal 15 and a positive pole of that source to the terminal 16, the device 10 will be forward biased and will conduct in the manner of a diode. If however, n-type silicon were to be used for the substrate 11, these potentials should be reversed.

During conduction through the device 10, light is generated, which is believed to come from the porous silicon layer 12. The formation of columns 21 of silicon ensure that the optimum electric field is produced in the vicinity of the porous layer 12. In addition, a benefit of using silver is that there is an electromagnetic enhancement effect with silver due to the excitation of surface plasmons. The use of a digitated structure for the electrode 13 improves the distribution of generated light over the device 10, since, in operation, the current density within the porous layer 12 is higher at the electrode edges, giving an edge emission effect.

One embodiment of the device 10 was subjected to an electrical bias voltage in the range 7 to 9 volts applied across the connections 15 and 16. This resulted in a current density in the range 100–200 mAcm$^{-2}$ flowing in the device 10. Orange electroluminescence emission was clearly observed from the device 10. The emission was localised at edges and holes in the electrode 13.

Whereas silver has a number of meritorious properties rendering it suitable for use in the invention, it suffers from the disadvantage of having a tendency to diffuse in a porous structure. It would therefore be advantageous to provide an alternative island and/or electrode material which exhibited the meritorious properties of silver but had lower diffusion characteristics. Silicide compounds are possible candidates for this.

In order to facilitate formation of the electrode 13 and its connection to the islands 20, it is possible to fill the pores of the porous layer 12 with an inert material providing a planar surface at the level of the islands 20. The inert material should be an insulating dielectric, eg a polymer such as polymethylmethacrycrate, polyethylene or polytetrafluoroethylene. The polymer may be introduced into the porous layer 12 in solution, and subsequently baked to remove solvent. Alternatively, a monomer may be used to fill the porous layer pores and subsequently polymerised in situ chemically or using ultra-violet light. Subsequently, excess polymer may be removed by etching or polishing to expose the islands 20 in a polymer surface. An electrode may then be deposited on the polymer surface to contact the islands 20.

As already mentioned, there is currently some uncertainty as to the mechanism of electroluminescence in porous silicon structures, and the invention is not to be construed as being restricted to any particular mechanism. However, it is believed that anodisation and etching results in small regions of silicon being left encapsulated in porous silicon oxide. If anodising and etching is carried out in such a way as to structure the silicon as a chain of individual beads, typically of 1 nm to 10 nm in size, encapsulated within the silicon oxide, then these beads can act as quantum particles which can be excited into luminescence. In such a structure, luminescence in the quantum particles would be excited by positive holes tunnelling via the porous silicon from the p-type substrate on their way to the negative metal electrode.

Other possible mechanisms are:

(a) Quantum wire structures, as described by Canham (see above), (b) Amorphised silicon—this is a known red/orange emitter and the anodising/etching may act to render the surface region amorphous;

(c) A siloxene compound—SiOxHy—which is luminescent, is formed by the anodising and etching.

Figure 5:
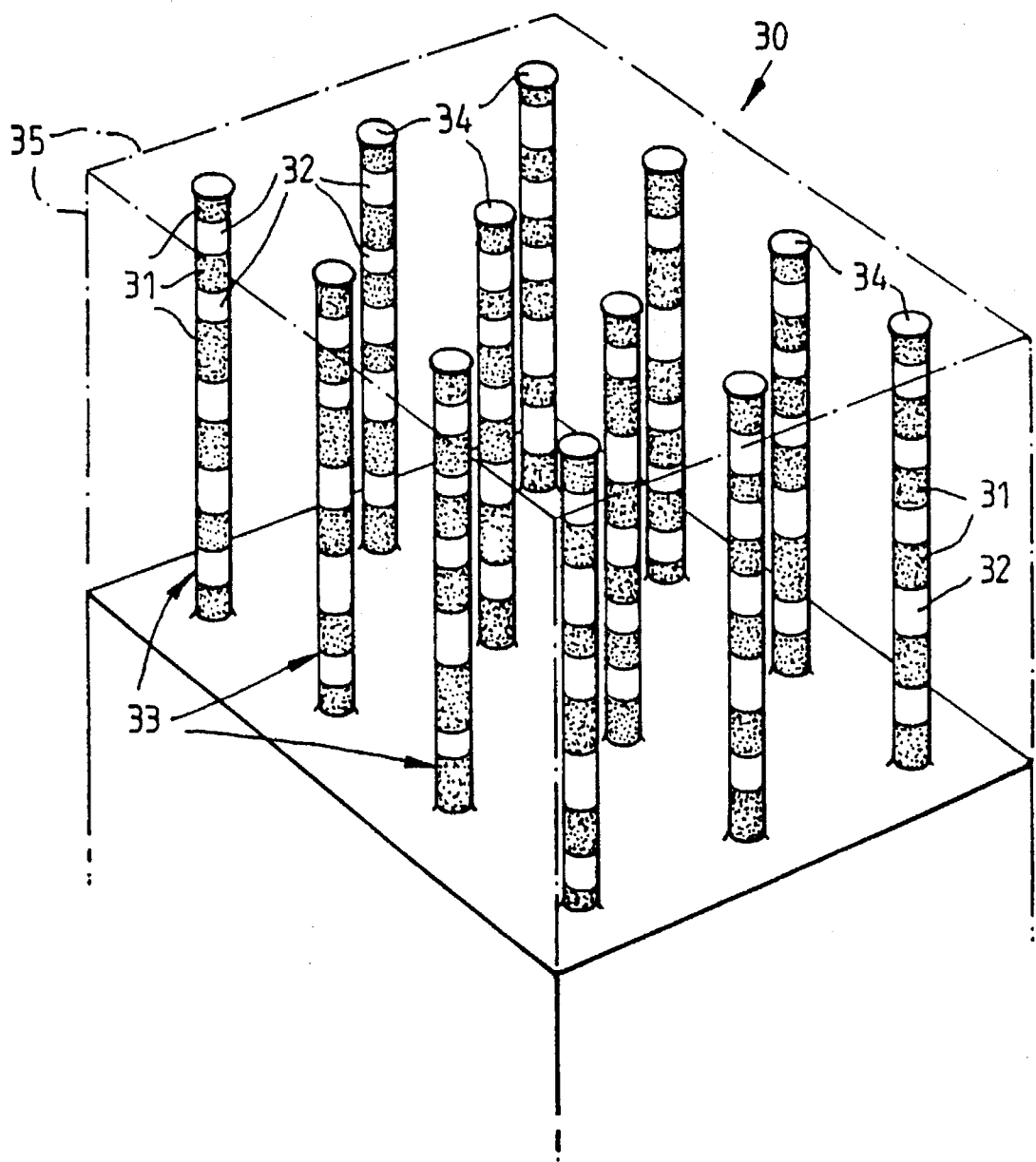
FIG. 5 is a schematic drawing of columns of silicon/silicon dioxide in a device of the invention.

Referring now to FIG. 5, there is shown a schematic drawing of a possible structure 30 of silicon material produced in accordance with the invention. The structure 30 consists of what are referred to as "beads" of silicon 31 connected by regions 32 to form columns 33 surmounted by respective metal islands such as 34. The regions 32 are of SiO$_2$ dielectric material. The beads 31 and regions 32 are of varying sizes. The columns 33 are embedded in a matrix, indicated by lines 35, of porous SiO$_2$; ie the matrix 35 is part SiO$_2$, part void.

Referring now also to FIG. 6, in which parts described earlier are like referenced, there is shown a schematic drawing of the band structure 40 of the structure 30 under an applied electrical bias voltage V$_{bias}$. It is assumed that the structure 30 was produced from a p type silicon substrate as indicated at 41. Quantum confinement occurs in the silicon beads 31 between wider band gap SiO$_2$ regions 32, as indicated by energy levels such as 42. Since the beads 31 are of varying size, the bound states within them are of varying energies; beads of lesser and, greater thicknesses correspond to higher and lower energy states respectively. The SiO$_2$ regions 32 are very thin, and an electron within an Si bead may either tunnel through an adjacent SiO$_2$ region or recombine with a hole within the same bead. Tunnelling between Si beads results in electrons and holes occupying a range of energy states which are related to the dimensions and shape of the respective bead in each case. Subsequent recombination produces a range of luminescent wavelengths.

It is advantageous to employ a Schottky diode structure in devices of the invention. This is because, as illustrated in FIG. 6, bending of valence and conduction bands at and near a semiconductor surface is reduced by the presence of the metal component of the barrier. A high degree of band bending has the effect of reducing electroluminescence emission.

We claim:

1. A light emitting device comprising:

a semiconductor material, at least a portion of said semiconductor is a porous material of low dimensionality;

a discontinuous layer comprising islands of electrically conducting material located upon at least a portion of said porous material; and contacting means for applying an electrical potential across said electrically conducting material and said porous material.

2. A device according to claim 1, wherein said porous material comprises pores and regions of solid material and said islands of electrically conducting material comprise an etch resistant material and said islands are located on an external surface of said porous material and said external surface is a solid region of said porous material.

3. A light emitting device comprising:

porous material of low dimensionality at least partly comprised of semiconductor material, said porous material including columns of low dimensionality;

regions of electrically conducting material located upon said columns; and contacting means for applying an electrical potential across the porous material and the electrically conducting material.

4. A device according to claim 2 wherein the islands have diameters in the range 5 nm to 100 nm.

5. A device according to claim 4 wherein the islands have diameters in the range 5 nm to 20 nm.

6. A device according to claim 5 wherein the islands have diameters in the range 10 nm to 20 nm.

7. A device according to claims 2 wherein the islands have spacings therebetween in the range 10 nm to 100 nm.

8. A device according to claim 7 wherein the islands have spacings therebetween in the range 10 nm to 50 nm.

9. A device according to claim 2 wherein the semiconductor material is silicon.

10. A device according to claim 2 wherein the semiconductor material and the electrically conducting material form a Schottky diode structure.

11. A device according to claim 2 wherein the electrically conducting material is silver.

12. A device according to claim 2 wherein the contacting means incorporates a digitated electrode structure connected to the electrically conducting material.

13. A device according to claim 12 wherein the digitated electrode structure has a grating pitch which provides means for at least one of selecting and enhancing light emission.

14. A device according to claim 13 wherein the grating pitch is in the range 0.5 µm to 1 µm.

15. A device according to claim 12 wherein the digitated electrode structure has fingers with width in the range 2 µm to 10 µm and a grating pitch in the range 4 µm to 20 µm.

16. A device according to claim 3 wherein the columns comprise beads of semiconductor material linked together by dielectric material.

17. A device according to claim 3 wherein the regions have diameters in the range 5 nm to 100 nm.

18. A device according to claim 17 wherein the regions have diameters in the range 5 to 20 nm.

19. A device according to claim 18 wherein the regions have diameters in the range 10 nm to 20 nm.

20. A device according to claim 14 wherein the regions have spacings therebetween in the range 10 nm to 100 nm.

21. A device according to claim 20 wherein the regions have spacings therebetween in the range 10 nm to 50 nm.

22. A device according to claim 3 wherein the semiconducting material is silicon.

23. A device according to claim 22 wherein the columns comprise silicon beads linked together by silicon dioxide material.

24. A device according to claim 3 wherein the semiconducting material and the electrically conducting material form a Schottky diode structure.

25. A device according to claim 3 wherein the electrically conducting material is silver.

26. A device according to claim 3 wherein the contacting means incorporate a digitated electrode structure connected to the electrically conducting material.

27. A device according to claim 26 wherein the digitated electrode structure has fingers arranged with a grating pitch which provides means for at least one of selecting and enhancing light emission.

28. A device according to claim 27 wherein the grating pitch is in the range 0.5 µm to 1 µm.

29. A device according to claim 26 wherein the digitated electrode structure has fingers with width in the range 2 µm to 10 µm and a grating pitch in the range 4 µm to 20 µm.

30. A method of making a light emitting device including the steps of:

(a) forming a discontinuous layer of islands of electrically conducting and etch resistant material upon semiconductor material, (b) anodising the semiconductor material to produce a porous region consisting at least partly of semiconductor material of low dimensionality and protected from anodisation by the electrically conducting and etch resistant material, and (c) providing electrical connections to the semiconductor material and to the electrically conducting and etch resistant material respectively.

31. A method according to claim 30 wherein the islands have diameters in the range 5 nm to 100 nm.

32. A method according to claim 31 wherein the islands have diameters in the range 5 nm to 20 nm.

33. A method according to claim 32 wherein the islands have diameters in the range 10 nm to 20 nm.

34. A method according to claim 30 wherein the islands have spacings therebetween in the range 10 nm to 100 nm.

35. A method according to claim 34 wherein the islands have spacings therebetween in the range 10 nm to 50 nm.

36. A method according to claim 30 wherein the semiconductor material is silicon.

37. A method according to claim 30 wherein the electrically conducting and etch resistant material and the semiconductor material form a Schottky diode structure.

38. A method according to claim 30 wherein the electrical connection to the electrically conducting and etch resistant material is a digitated electrode structure.

39. A method according to claim 30 wherein the islands are formed by vacuum deposition of silver onto semiconductor material maintained at a temperature appropriate to cause balling of the silver.

\* \* \* \* \*